(12) United States Patent
Noda et al.

(10) Patent No.: US 7,813,152 B2
(45) Date of Patent: Oct. 12, 2010

(54) POWER CONVERTER

(75) Inventors: Koji Noda, Fuji (JP); Michika Uesugi, Fuji (JP); Hiroshi Mochikawa, Hachioji (JP); Harunobu Nukushina, Fuji (JP); Keiichi Ishida, Fuji (JP); Takahisa Endo, Fujinomiya (JP)

(73) Assignee: Toshiba Carrier Corporation, Tokyo (JP)

( * ) Notice: Subject to any disclaimer, the term of this patent is extended or adjusted under 35 U.S.C. 154(b) by 219 days.

(21) Appl. No.: 12/096,335

(22) PCT Filed: Nov. 30, 2006

(86) PCT No.: PCT/JP2006/323931

§ 371 (c)(1),
(2), (4) Date: Aug. 27, 2008

(87) PCT Pub. No.: WO2007/066566

PCT Pub. Date: Jun. 14, 2007

(65) Prior Publication Data

US 2009/0279335 A1    Nov. 12, 2009

(30) Foreign Application Priority Data

Dec. 6, 2005 (JP) .............................. 2005-352194

(51) Int. Cl.
*H02M 7/5387* (2007.01)
*H02M 3/24* (2007.01)

(52) U.S. Cl. ........................................ 363/132; 363/98

(58) Field of Classification Search ................... 363/55, 363/56.01, 56.02, 95, 97, 98, 131, 132; 318/400.26, 318/400.27, 400.28, 801–803
See application file for complete search history.

(56) References Cited

U.S. PATENT DOCUMENTS

| 4,763,049 | A | * | 8/1988 | Magee | 318/400.27 |
|---|---|---|---|---|---|
| 5,111,373 | A | * | 5/1992 | Higaki | 363/37 |
| 5,946,208 | A | * | 8/1999 | Yamamoto et al. | 363/132 |
| 6,058,037 | A | | 5/2000 | Shibata et al. | |
| 6,847,531 | B2 | * | 1/2005 | Bixel | 363/71 |
| 2009/0243531 | A1 | * | 10/2009 | Hirono | 318/504 |

FOREIGN PATENT DOCUMENTS

JP    10-327585    12/1998

OTHER PUBLICATIONS

Background Art Information Sheet dated Jul. 1, 2008.
English translation of Background Art Information Sheet dated Jul. 1, 2008.
Machine English translation of JP 10-327585, published Dec. 8, 1998.
International Search Report from PCT/JP2006/323931.
English Abstract of JP-10-327585.

* cited by examiner

*Primary Examiner*—Matthew V Nguyen
(74) *Attorney, Agent, or Firm*—DLA Piper LLP US

(57) ABSTRACT

To provide a power converter, comprising: a pair of main circuit switching elements to which diodes are connected; a means for generating a first PWM basic signal for driving a main circuit switching element; and a reverse voltage application circuit to be operated, triggered by a second PWM basic signal which differs from the first PWM basic signal only in phase.

6 Claims, 13 Drawing Sheets

US 7,813,152 B2

POWER CONVERTER

TECHNICAL FIELD

The present invention relates to a power converter for supplying power to an inductive load, the power converter using an FET in at least one of main circuit switching elements.

BACKGROUND ART

In recent years, MOSFETs, such as a super junction MOSFET, highly efficient with a low on-resistance have been developed. Moreover, conventionally, there has been proposed a power converter for driving an inductive load, the power converter using an MOSFET as a switching element provided in an inverter circuit inside the power converter (see Japanese Patent Application Publication No. Hei 10-327585, and hereinafter, referred to as the "official gazette" as needed).

In the power converter in this proposal, reverse voltage application circuits are each provided to reduce a loss caused by a reverse current that is generated, according to the ON/OFF of a MOSFET serving as a switching element, in a parasitic diode (a diode naturally created on a circuit due to the structure of the MOSFET) connected in antiparallel with the MOSFET. Namely, when one of the MOSFETs changes from ON to OFF, this reverse voltage application circuit applies a reverse voltage to the parasitic diode before the ON timing of the other FET that is paired with the former MOSFET. The applied reverse voltage is based on a drive signal generated by combining a PWM (Pulse Width Modulation) basic signal with an OFF signal of the MOSFET from which the reverse voltage is applied, the PWM basic signal being generated by comparing a triangular waveform signal with a reference signal, the reference signal being based on a reference frequency and a reference voltage.

DISCLOSURE OF THE INVENTION

Here, in the above-described official gazette, a signal obtained by processing the PWM basic signal, and a switching signal after a delay for preventing simultaneous ON of the switching elements are used for the generation of a drive signal for the reverse voltage application.

However, usually, due to a relation between the pulse width of the PWM basic signal and the delay time of a delay circuit, the drive signal for applying the reverse voltage may not be generated successfully.

This situation will be described more specifically. FIG. 13 is a time chart showing the ON or OFF state of each signal that is generated based on the PWM basic signal generated from a reference signal and a triangular waveform signal. Reference numerals from "t1" to "t6" are given to the respective pulses of the PWM basic signal. In this time chart, a pair of main circuit switching elements is denoted as an "upper arm" and a "lower arm", respectively, and an "upper arm switching signal" and a "lower arm switching signal" are signals that are outputted to drive respective MOSFETs, which are switching elements. Moreover, an "upper arm reverse voltage application signal" and a "lower arm reverse voltage application signal" are signals that are outputted to instruct switching elements (hereinafter, referred to as the "reverse voltage application switching elements") to apply the reverse voltages, the switching elements each being provided in the reverse voltage application circuit and applying the reverse voltage to its corresponding parasitic diode.

When the PWM basic signal as shown on the top of the time chart of FIG. 13 is generated, a certain delay is provided after the upper arm switching signal for driving the MOSFET of the upper arm changes from ON to OFF, and then, as shown as the solid line a, the reverse voltage is applied to the parasitic diode of the MOSFET of the upper arm (the upper arm reverse voltage application signal is turned on). Moreover, similarly, after the lower arm switching signal for driving the MOSFET of the lower arm changes from ON to OFF, as shown by the solid line b, the reverse voltage is applied to the parasitic diode of the MOSFET of the lower arm (the lower arm reverse voltage application signal is turned on).

If an ON signal is simultaneously applied to a pair of MOSFETs provided on the upper and lower arms, the pair of MOSFETs will usually be short-circuited. For this reason, a delay circuit delays the actual ON signal of the MOSFET from the PWM basic signal by a predetermined time (hereinafter, this time is referred to as a "dead time" or a "delay time", and this time width is denoted as "td") in order to shift the timing of the ON signal applied to each of the upper and lower arms. As shown by the dotted line c of FIG. 13, if the pulse width of the PWM basic signal is smaller than the time width td of the dead time (see a pulse "t5" in the PWM basic signal), the ON signal for driving the lower arm will not be generated. However, usually, the timing for change from ON to OFF of the switching element after a delay is basically used as the base for the signal for applying the reverse voltage. Accordingly, when the lower arm switching signal remains OFF, the lower arm reverse voltage application signal, which is supposed to be outputted provided that the lower arm switching signal has changed from ON to OFF, will not be generated (this is illustrated with the dotted line in the "lower arm reverse voltage application signal" of FIG. 13), and thus the reverse voltage will not be applied to the parasitic diode of the MOSFET of the lower arm. For this reason, it is impossible to control the reverse current that is generated at this timing and flows into the parasitic diode.

Note that, in the system described in the above-described official gazette, a signal obtained by processing (delaying) the PWM basic signal and a switching signal for the switching element, the switching signal being obtained after a delay, are used to generate the signal for applying the reverse voltage. However, in this document, it is unclear how to generate the processed PWM basic signal, and thus it is not obvious whether or not the system can address the above-described state in which the switching signal of the switching element is not outputted.

Moreover, other than the above-described problem that the switching signal for applying the reverse voltage cannot be generated successfully due to the relation between the pulse width of the PWM basic signal and the delay time of the delay circuit, further problems below are also pointed out.

For example, when the duty cycle of the PWM basic signal approaches 0%, the ON time of the reverse voltage application switching element becomes longer than the ON time of the main circuit switching element (FET), so that a wasteful reverse current may flow.

Moreover, if the reverse voltage application circuit is configured as a logic circuit without including a microcomputer, as in the above-described official gazette, then in performing a short-circuit check or the like, it is difficult to separately determine whether or not each of the main circuit switching element and the reverse voltage application circuit has an abnormality. Moreover, if attempting to separately determine these, an addition of a new circuit is required, which is not practical.

The present invention has been made to solve the above-described problems, and it is an object of the present invention to provide a power converter capable of surely operating a reverse voltage application circuit even if the pulse width of a PWM basic signal becomes shorter than the dead time. Moreover, it is another object of the present invention to provide a power converter capable of preventing a wasteful current flow which might be caused by the fact that a signal applied to a parasitic diode remains ON although the drive signal of a main circuit switching element is already OFF. Furthermore, it is yet another object of the present invention to provide a power converter capable of performing abnormality diagnosis of a main circuit switching element and a reverse voltage application circuit, separately, during startup of an inverter circuit.

According to a first aspect concerning an embodiment of the present invention, a power converter comprises: a pair of main circuit switching elements connected to a direct-current voltage source and supplying power to an inductive load by ON/OFF drive, wherein at least one of the pair comprises an FET; a diode connected in antiparallel with each of the pair of main circuit switching elements; a reverse voltage application means that applies a reverse voltage lower than a voltage of the direct-current power source to the diode connected in antiparallel with the FET; a first PWM basic-signal generating means that generates a first PWM basic signal for ON/OFF-driving the pair of main circuit switching elements; a second PWM basic-signal generating means that generates a second PWM basic signal having a phase lead with respect to the first PWM basic signal; and a one-shot pulse generating means that generates a reverse voltage application signal based on the second PWM basic signal, the reverse voltage application signal being for driving the reverse voltage application means for a predetermined period.

According to a second aspect concerning the embodiment of the present invention, a power converter comprises: a pair of main circuit switching elements connected to a direct-current voltage source and supplying power to an inductive load by ON/OFF drive, wherein at least one of the pair comprises an FET; a diode connected in antiparallel with each of the pair of main circuit switching elements; a reverse voltage application means that applies a reverse voltage lower than a voltage of the direct-current power source to the diode connected in antiparallel with the FET; a switching signal generating means that generates a switching signal of the pair of main circuit switching elements based on a PWM basic signal in order to ON/OFF-drive the pair of main circuit switching elements; a one-shot pulse generating means that generates a reverse voltage application signal for operating the reverse voltage application means at a predetermined timing; and a signal correction means for receiving a reverse voltage application signal, and a switching signal to the FET, to which a reverse voltage is applied based on the reverse voltage application signal, and further for outputting the inputted reverse voltage application signal as it is when the switching signal is OFF, and turning off the inputted reverse voltage application signal when the switching signal is ON.

BEST MODE FOR CARRYING OUT THE INVENTION

Hereinafter, a first embodiment of the present invention will be described in detail with reference to the accompanying drawings.

First Embodiment

Figure 1:
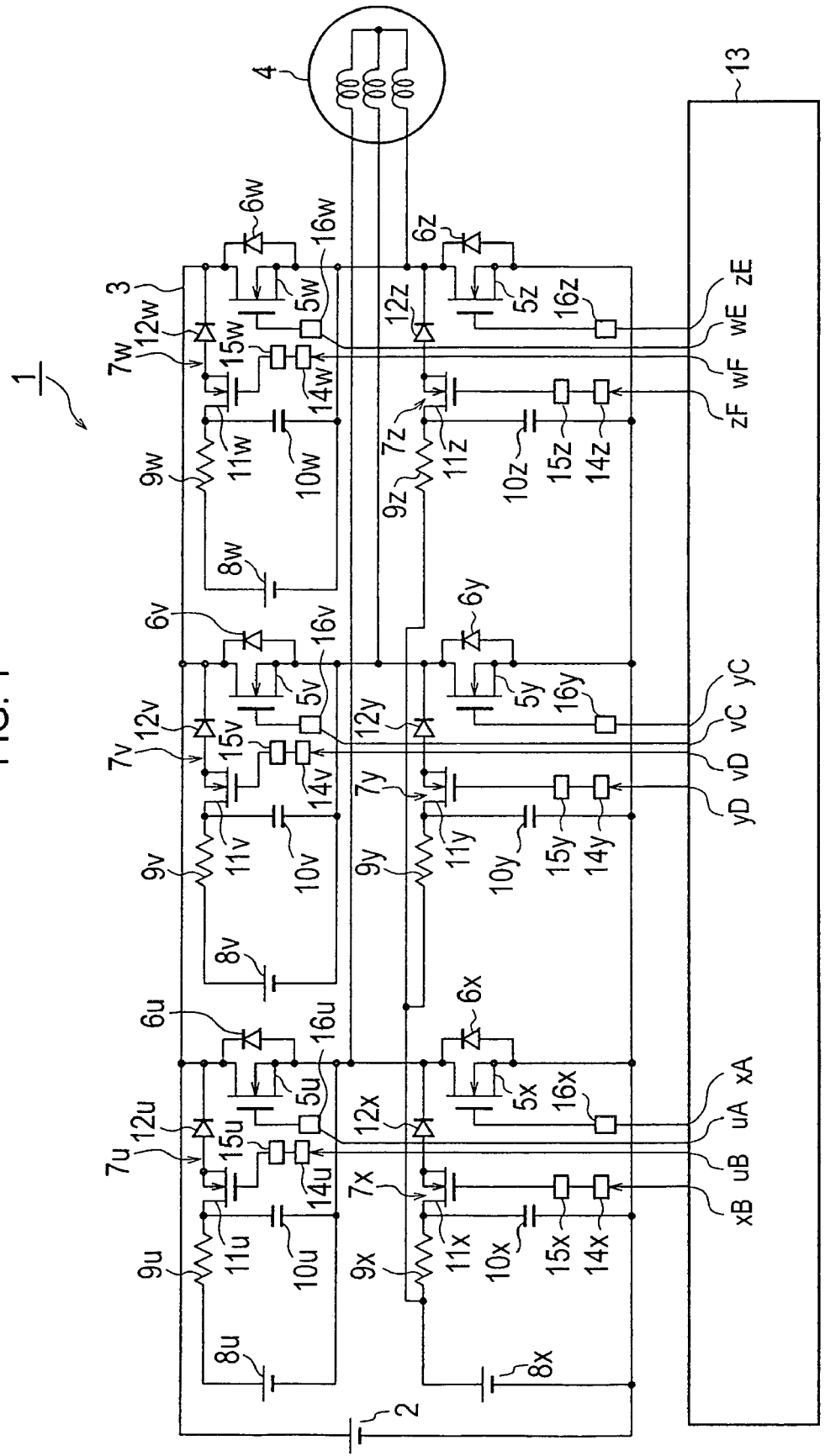
FIG. 1 is a whole configuration diagram showing a power converter in a first embodiment.

As shown in FIG. 1, in a power converter 1 concerning the first embodiment of the present invention, an inverter circuit 3 is connected in series with a power source line of a direct-current voltage source 2, and an inductive load 4, such as a motor, for example, is connected to the output side of the inverter circuit 3.

To the inverter circuit 3, upper side element MOSFETs $5u$ to $5w$ and lower side element MOSFETs $5x$ to $5z$, which are main circuit switching elements, are connected in a three-phase bridge configuration. Here, MOSFETs $5u$ and $5x$, MOSFETs $5v$ and $5y$, and MOSFETs $5w$ and $5z$ constitute a pair of main circuit switching elements, respectively. The MOSFET 5 comprises a super junction MOSFET. Diodes (parasitic diodes) $6u$ to $6w$ and $6x$ to $6z$ are connected in anti-parallel between a source and drain of MOSFETs $5u$ to $5w$ and $5x$ to $5z$, respectively. Note that although these switching elements comprise a low on-resistance MOSFET, one of the MOSFETs of any pair of main circuit switching elements may be an IGBT, and in that case, it is preferable that the upper side element is an IGBT and the lower side element is an MOSFET.

To a gate of each main circuit switching element 5, drive means $16u$ to $16z$ are provided, respectively, so that each main circuit switching element 5 is ON/OFF-driven by an output of the driving means 16 based on a switching signal, which is outputted from a microcomputer 13 to each main circuit switching element 5.

To the diodes $6u$ to $6w$ and $6x$ to $6z$, reverse voltage application circuits $7u$ to $7w$ and $7x$ to $7z$ as the reverse voltage application means are connected, respectively. The reverse voltage application circuit 7 includes a low-voltage direct-current voltage source 8 having a lower voltage than the direct-current voltage source 2, while in the reverse voltage application circuits 7x to 7z, a low-voltage direct-current voltage source 8x is shared. The low-voltage direct-current voltage source 8 is connected between the source and drain of the MOSFETs 5u to 5w and 5x to 5z, respectively.

Resistors 9u to 9w and 9x to 9z are provided in series with the low-voltage direct-current voltage source 8 of the reverse voltage application circuit 7, and furthermore capacitors 10u to 10w and 10x to 10z are connected in parallel. The resistor 9 is provided to prevent a rush current associated with the charging of the capacitor 10. Moreover, reverse voltage application switching elements 11u to 11w and 11x to 11z, and diodes 12u to 12w and 12x to 12z for preventing a reverse current are connected on the power source line of the low-voltage direct-current voltage source 8. Here, for the reverse voltage application switching element 11, a MOSFET having a small power consumption is suitably used.

Switching signals outputted from the microcomputer 13 are supplied to the reverse voltage application circuit 7 via one-shot pulse generating means 14u to 14w and 14x to 14z and gate driving means 15u to 15w and 15x to 15z, respectively. These one-shot pulse generating means 14 and gate driving means 15 supply an ON signal to the reverse voltage application switching element 11 in a certain delay after the switching signal changes from ON to OFF, and keep them turned on for a predetermined short time, and thereafter turn them off. As a result, the reverse voltage application switching element 11 can apply a reverse voltage to the (parasitic) diode 6 over a period before and after a MOSFET paired with the corresponding MOSFET changes from OFF to ON. As a result, a reverse current that flows into the (parasitic) diode connected in antiparallel with the MOSFET can be suppressed.

The microcomputer 13 is connected to the inverter circuit 3 via: output terminals xA, uA, vC, yC, wE, and zE for outputting the switching signals that are applied to each main circuit switching element 5 of U phase to W phase and X phase to Z phase; and output terminals xB, uB, yD, vD, zF, and wF for outputting signals that drive the reverse voltage application circuit 7 via the one-shot pulse generating means 14 and the gate driving means 15 of U phase to W phase and X phase to Z phase.

Figure 2:
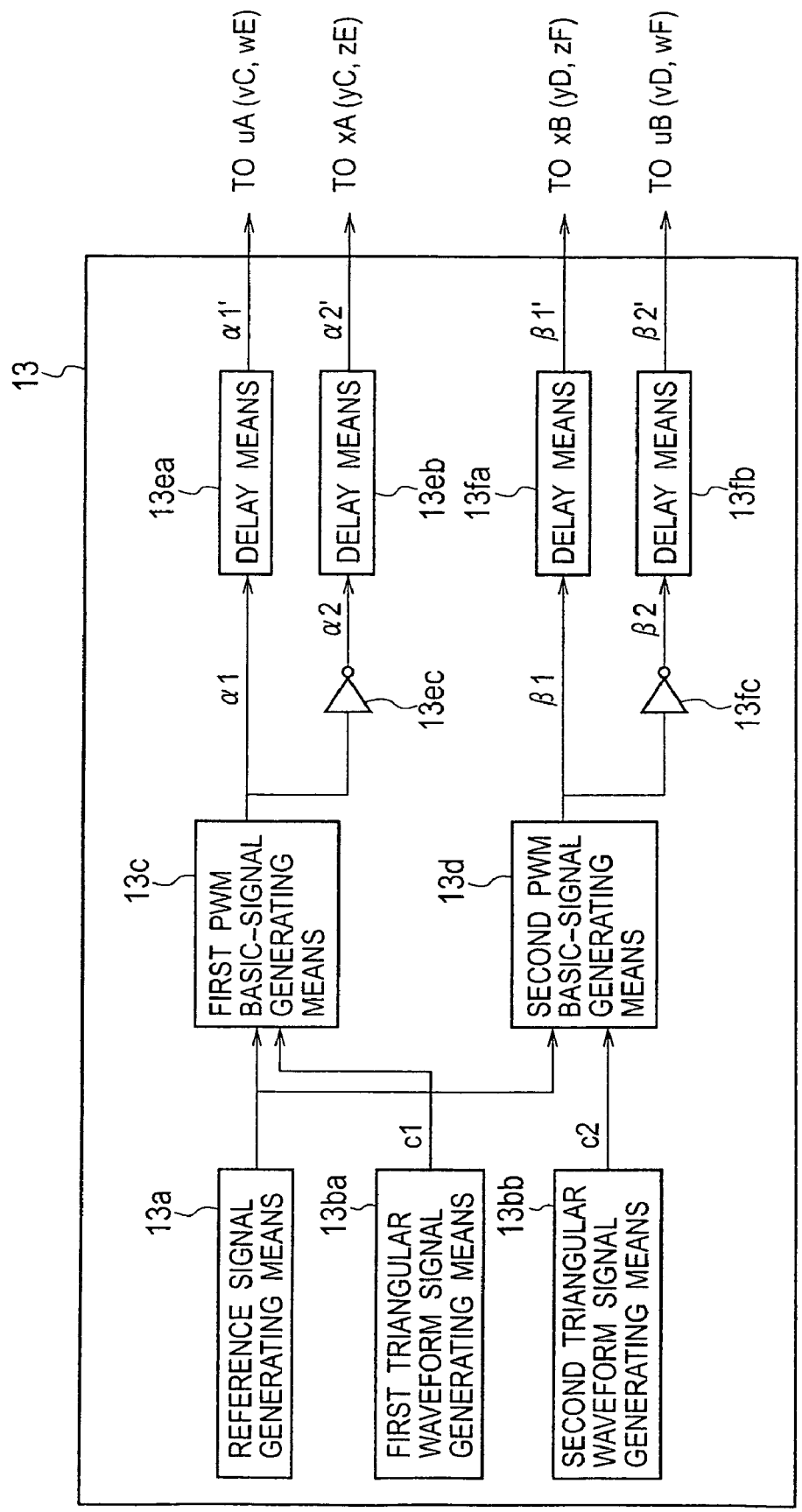
FIG. 2 is a block diagram showing the configuration of a microcomputer in the first embodiment.

As shown in FIG. 2, in order to generate the switching signals applied to the main circuit switching elements, the microcomputer 13 includes: a reference signal generating means 13a for generating a reference signal; a first triangular waveform signal generating means 13ba for generating a triangular waveform signal having a predetermined cycle; a first PWM basic-signal generating means 13c that receives an output of the reference signal generating means 13a and an output of the first triangular waveform signal generating means 13ba and generates a PWM basic signal (hereinafter, referred to as the "first PWM basic signal") serving as the base for generating switching signals; an inverting means 13ec to which the first PWM basic signal is inputted; and delay means 13ea, 13eb. The outputs of the delay means 13ea, 13eb in the final stage serve as the switching signals for driving the main circuit switching elements.

Furthermore, in order to generate a PWM basic signal (hereinafter, referred to as a "second PWM basic signal") serving as a trigger of the reverse voltage application signal applied to the reverse voltage application switching elements 11, the microcomputer 13 includes: a second triangular waveform signal generating means 13bb that outputs a triangular waveform having the same cycle as that of the triangular waveform, which the first triangular waveform signal generating means 13ba outputs, and also having a phase leading by a predetermined time; a second PWM basic-signal generating means 13d that outputs a result of the comparison in magnitude between the reference signal outputted by the reference signal generating means 13a and the triangular waveform signal outputted by the second triangular waveform signal generating means 13bb; an inverting means 13fc to which the second PWM basic signal is inputted; and delay means 13fa, 13fb. Then, the outputs of the delay means 13fa, 13fb in the final stage serve as triggers of the reverse voltage application signals. Note that, for simplicity of illustration, in FIG. 2, only the drive signal generating parts corresponding to the U phase and X phase are illustrated, however, also in other V and Y phases and W and Z phases, the same configuration is provided except only that the output phase of the reference signal generating means 13a differs.

The inverting means 13ec, 13fc include an inverter circuit for inverting each inputted PWM basic signal, respectively. The delay means 13ea, 13eb are circuits which, in driving the main circuit switching elements, delay only ON timing of the inputted PWM basic signal by a predetermined time (dead time) in order to prevent a short circuit, which might be caused by a switching signal (hereinafter, referred to as an "ON signal") that are applied to both of a pair of upper and lower switching elements to simultaneously turn on the both elements. The predetermined time (dead time) is preferably as short as possible from the viewpoint of the efficiency, within the range capable of preventing the short circuit (e.g., about 2 to 3 μs). More specifically, the delay means 13e delays the start of the ON signal, however, even in this case, a priority is given to a switching signal (hereinafter, referred to as an "OFF signal") that turns off the main circuit switching element. That is, if the input signal has changed from ON to OFF while the inputted ON signal is being delayed, then the priority is given to OFF and therefore the output of the ON signal is masked and thus the output of the delay means 13e is kept OFF. For this reason, as described in the prior art, a condition occurs where the main circuit switching element will not be turned on despite that the PWM basic signal is in the ON state.

The delay means 13fa, 13fb are the ones for outputting switching signals, which drive the reverse voltage application switching elements via the later-described one-shot pulse generating means from the output terminals uB, xB (yD, vD, zF, wF), thereby applying a reverse voltage to the parasitic diode via the reverse voltage application circuit 7. The delay means 13fa, 13fb comprise the same delay circuit as that of the delay means 13ea, 13eb. In the first embodiment, the same delay time is set for all the delay means. The reference signal generating means 13a and the first triangular waveform signal generating means 13ba generate the reference signal and first triangular waveform signal serving as the base of the first PWM basic signal, respectively. In the first embodiment, these reference signal generating means 13a and first triangular waveform signal generating means 13ba are provided inside the microcomputer 13, however, these may be provided outside the microcomputer 13.

Figure 13:
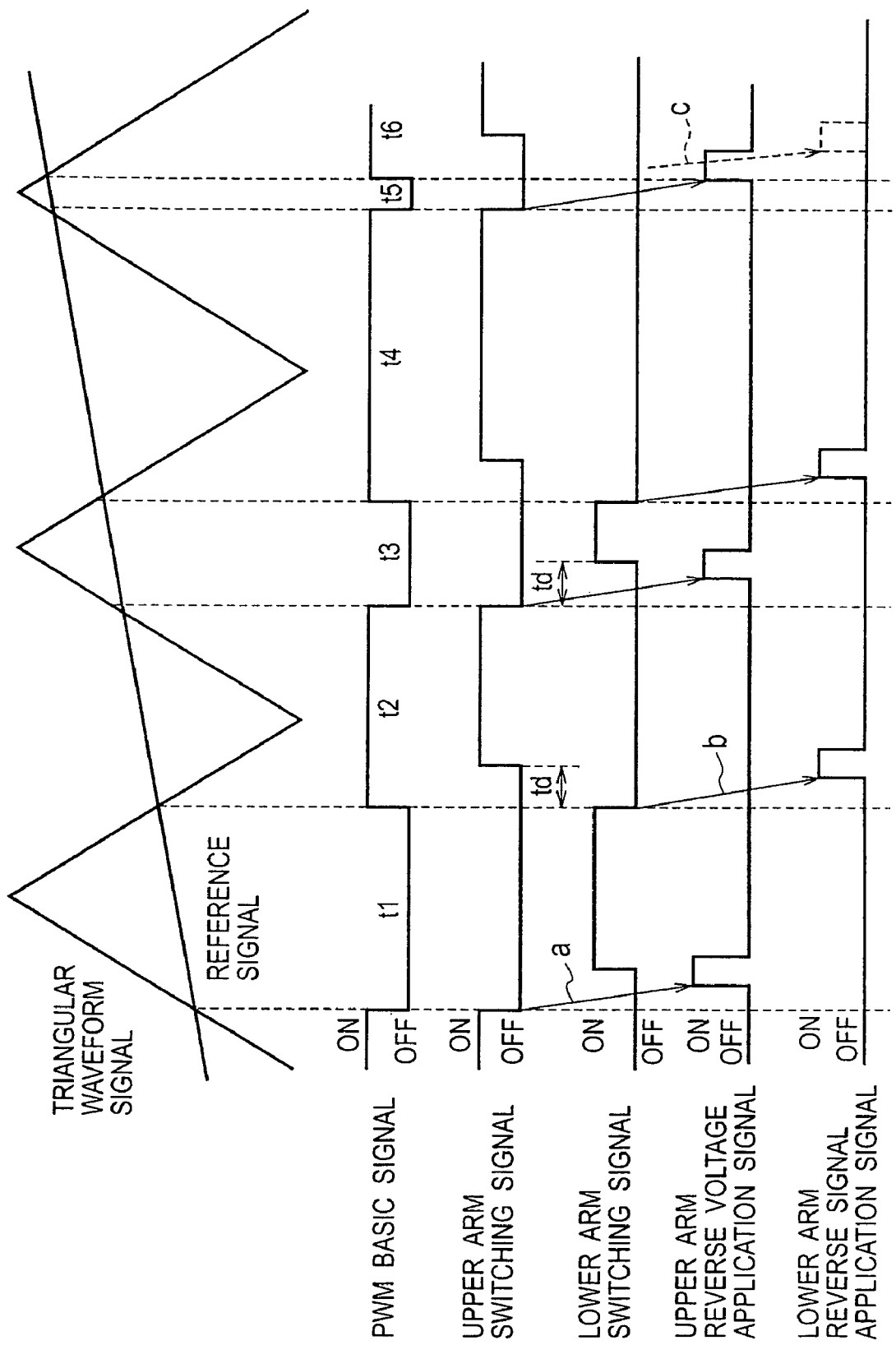
FIG. 13 is a time chart showing signals applied to a main circuit switching element and parasitic diode in a conventional embodiment.

The first PWM basic-signal generating means 13c generates the first PWM basic signal serving as the base of the switching signal applied to the main circuit switching element, based on the comparison in magnitude between the reference signal and the triangular waveform signal. That is, as shown in FIG. 13 described above, the PWM basic signal is generated so as to perform the ON or OFF operation on the basis of a result of the comparison in magnitude between the reference signal and the triangular waveform signal.

The second PWM basic-signal generating means 13d basically has the same function as that of the first PWM basic-signal generating means 13c, and generates the second PWM basic signal from the reference signal and the second triangular waveform signal. The second PWM basic signal is applied to the one-shot pulse generating means 14 via the above-described delay means 13fa, 13fb, inverting means 13fc, and output terminals uB, xB, and plays a role as the trigger signal of the later-described reverse voltage application signal. In the first embodiment, a small value of less than 180 degrees is set for the phase difference between the first triangular waveform signal and the second triangular waveform signal, and in this case, a noninverting output outputted via the delay means 13fa from the second PWM basic-signal generating means 13d serves as the trigger of the reverse voltage application signal for driving the reverse voltage application switching element lx of the reverse voltage application circuit 7x corresponding to the main circuit switching element 5x, to which a switching signal that is inverted and outputted from the first PWM basic-signal generating means 13c is supplied. On the other hand, an inverted output outputted via the inverting means 13fc and delay means 13fb from the second PWM basic-signal generating means 13d serves as the trigger of the reverse voltage application signal for driving the reverse voltage application switching element 11u of the reverse voltage application circuit 7u corresponding to the main circuit switching element 5u, to which a switching signal that is inverted and outputted from the first PWM basic-signal generating means 13c is supplied.

Note that if the phase difference between the first triangular waveform signal and the second triangular waveform signal is set to no less than 180 degrees (and less than 360 degrees), then the noninverting output from the second PWM basic-signal generating means 13d may serve as the reverse voltage application signal for driving the reverse voltage application switching element 11u corresponding to the main circuit switching element 5u, and in contrast the inverted output from the second PWM basic-signal generating means 13d may serve as the trigger of the reverse voltage application signal of the reverse voltage application switching element 11x corresponding to the main circuit switching element 5x.

Figure 3:
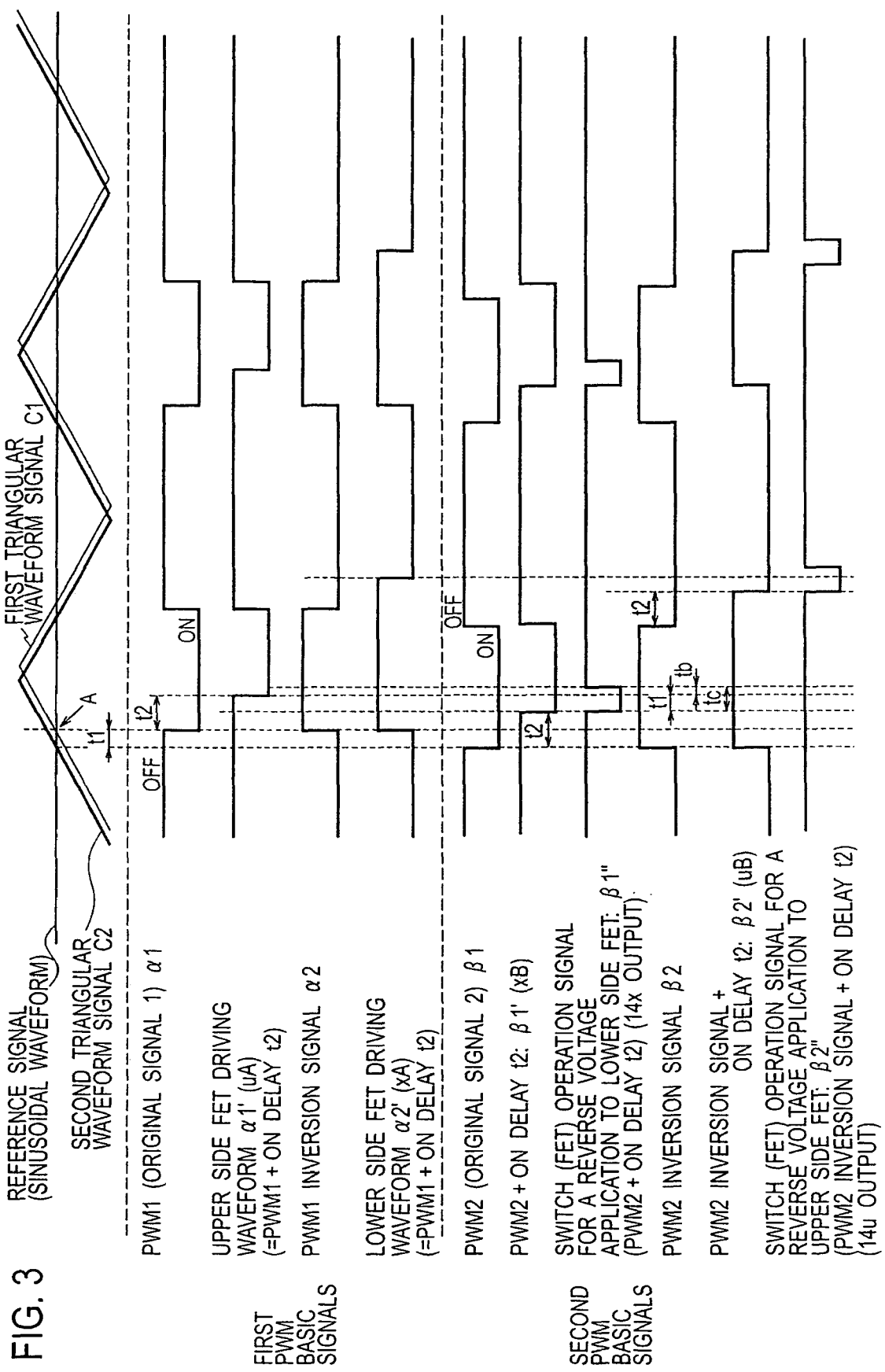
FIG. 3 is a time chart showing the waveforms of signals generated in the microcomputer.

Here, a time chart shown in FIG. 3 shows the output signals (ON and OFF) of each part for a pair of main circuit switching elements, e.g., 5u, 5x, and this time chart is roughly divided into the upper, middle, and lower parts by two horizontal dotted lines. Note that, in this time chart, the signals are low active, i.e., a high level represents OFF and a low level represents ON. This is because the circuits of the driving means 16 and gate driving means 15 in the final stage are configured as low active, but the circuits may be easily configured as high active by inverting all these circuits.

On the top of FIG. 3 are illustrated the respective waveforms of the basic signal generated in the reference signal generating means 13a, and the reference signal and first triangular waveform signal c1 and the second triangular waveform signal c2 generated in the first triangular waveform signal generating means 13ba and second triangular waveform signal waveform 13bb. The first triangular waveform signal c1 differs from the second triangular waveform signal c2 in that the second triangular waveform signal c2 leads to the first triangular waveform signal c1 by t1 (e.g., 1 μs), only in phase.

Next, the middle part of FIG. 3 illustrates signals generated based on the first PWM basic signal. Here, among a pair of main circuit switching elements, a main circuit switching element having the (parasitic) diode to which a reverse voltage is applied is referred to as an "own element" and the other one of the main circuit switching elements, the other one being paired with the own element is referred to as a "complementary element", and the description is made using these terms. Note that, if both of the pair of main circuit switching elements are formed from FETs, the relation between the own element and the complementary element is a relative one.

An original signal α1 of the first PWM basic signal becomes ON (low) when the first triangular waveform signal is larger than the reference signal (see the time point A of FIG. 3). On the basis of the original signal α1, a switching signal α1' is generated while being delayed by t2 (dead time, e.g., 3 μs) in the delay means 13ea, and is then supplied to the own element. On the other hand, to the complementary element is supplied a switching signal α2' obtained by delaying a signal α2 by t2 in the delay means 13eb, the signal α2 being obtained by inverting the original signal α1 by the inverting means 13ec.

The lower part of FIG. 3 illustrates signals generated based on the second PWM basic signal. Since the phase of the second PWM basic signal leads by t1 as compared with the first PWM basic signal, an original signal β1 of the second PWM basic signal becomes ON earlier by t1 than the original signal α1 of the first PWM basic signal.

An inversion signal β2 of this original signal is delayed by t2 in the delay means 13fb to serve as the inversion signal β2', and is then supplied to the one-shot pulse generating means 14, where a signal (reverse voltage application signal) β2", having a predetermined ON time width tc, applied to the reverse voltage application switching element 11 of the own element is generated. On the other hand, a signal β1' obtained by delaying the original signal β1 from the second PWM basic-signal generating means 13d by t2 in the delay means 13fa is converted into the reverse voltage application signal β1" having the predetermined ON time width tc in the one-shot pulse generating means 14, and this signal is supplied to the reverse voltage application switching element 11 of the complementary element via the driving circuit 15X. Note that, since the β1" signal generation in the one-shot pulse generating means 14 is completed in an extremely short time as compared with the delay time in the delay means 13e, the delay time in this part is negligible.

The first and second PWM basic signals generated in the first PWM basic-signal generating means 13c and the second PWM basic-signal generating means 13d are generated under the same frequency and the same command value. However, since the second PWM basic signal uses the second triangular waveform signal whose phase leads by t1 with respect to the first triangular waveform signal for generating the first PWM basic signal, the second PWM basic signal and various kinds of signals based on this will have a phase (time) lead by t1 with respect to the first PWM basic signal and the various kinds of signals based on this, respectively.

As a result, the ON timing of the reverse voltage application signal of the own element is outputted earlier by t1 than the inverted output of the first PWM basic signal, and further leads by t1 with respect to a timing at which the complementary element delayed by t2 is turned on, as shown in FIG. 3. Accordingly, it is possible to apply the reverse voltage to the diode of the own element before the complementary element is turned on. Here, the ON time width tc of the reverse voltage application signal is set larger than t1, so that the ON period of the reverse voltage application signal of the own element may start earlier by t1 than the ON timing of the complementary element and may complete later by tb (=tc−t1) than the ON timing of the complementary element. As a result, during the short period of time (tb) after the complementary element is turned on, a time for the reverse voltage to be applied to the diode connected in antiparallel with the own element can be secured and it is therefore possible to surely suppress the reverse current of this diode. For example, if set to t1=1 μsec and tc=2 μsec, then 1 μsec can be secured as tb.

As described above, with the use of two PWM basic signals having different phases, a switching signal of the main circuit switching element including an MOSFET having a parasitic diode, to which a reverse voltage is applied, is generated from one of the PWM basic signals, and a reverse voltage application signal for applying a reverse voltage to this parasitic diode is generated from the other PWM basic signal having a lead phase. Thereby, it is possible to obtain a power converter which can, when the pulse width of the PWM basic signal on the own element side becomes smaller than the dead time, prevent the occurrence of such a state that the reverse voltage application circuit does not operate while a reverse current may flow into the parasitic diode, and thus to suppress a reverse current from flowing into the parasitic diode whenever required, thereby achieving a reduction in power consumption or noise. Moreover, in contrast, when the pulse width of the PWM basic signal on the complementary element side becomes smaller than the dead time, the wasteful power consumption can be suppressed by preventing the occurrence of such a state that the reverse voltage application circuit unnecessarily operates.

Note that, in the above-described embodiment, all the delay times of the delay means 13e are set to be the same; however, the delay time of each delay means 13e may be modified within a certain range. In this case, the ON timing of the reverse voltage application signal may be adjusted using both of a phase difference in the both PWM basic signals and additionally a difference between the delay times in the delay means. However, if the delay times are set to differ from each other, then even when the ON signal with respect to the own element has been masked, the reverse voltage application circuit 7 of the complementary element will operate to apply a wasteful reverse voltage or the reverse voltage application operation may not be carried out depending on the timing. Furthermore, while the own element is ON, the reverse voltage application circuit 7 thereof will operate. It is therefore preferable that the delay times of at least a set of the following two delay means are set to be the same: one of the delay means corresponding to each main circuit switching element 5, and the other one of the delay means corresponding to the reverse voltage application circuit 7 of this element (e.g., 13ea and 13fb, or 13eb and 13fa).

Note that, in recent years, a microcomputer having two sets of three-phase PWM outputs capable of simultaneously operating two inverter apparatuses, i.e., an inverter apparatus for driving a compressor motor and an inverter apparatus for driving a blower motor, in an air conditioner has been developed, and thus if such a microcomputer is used, this embodiment can be configured extremely easily.

Second Embodiment

Next, a second embodiment in the present invention is described. Note that, in the second embodiment, the same component as the component described in the first embodiment is given the same reference numeral, and the description of the same component is omitted since it requires duplication.

The second embodiment differs in configuration from the first embodiment in that a reverse voltage application signal correction means 20 incorporating the one-shot pulse generating means 14 of the first embodiment is provided, and that a switching means 13h capable of switching the output/non-output of a reverse voltage application signal is provided in the microcomputer in FIG. 2. The switching means 13h outputs "H" when allowing the reverse voltage application signal, and outputs "L" when not allowing the same.

Figure 4:
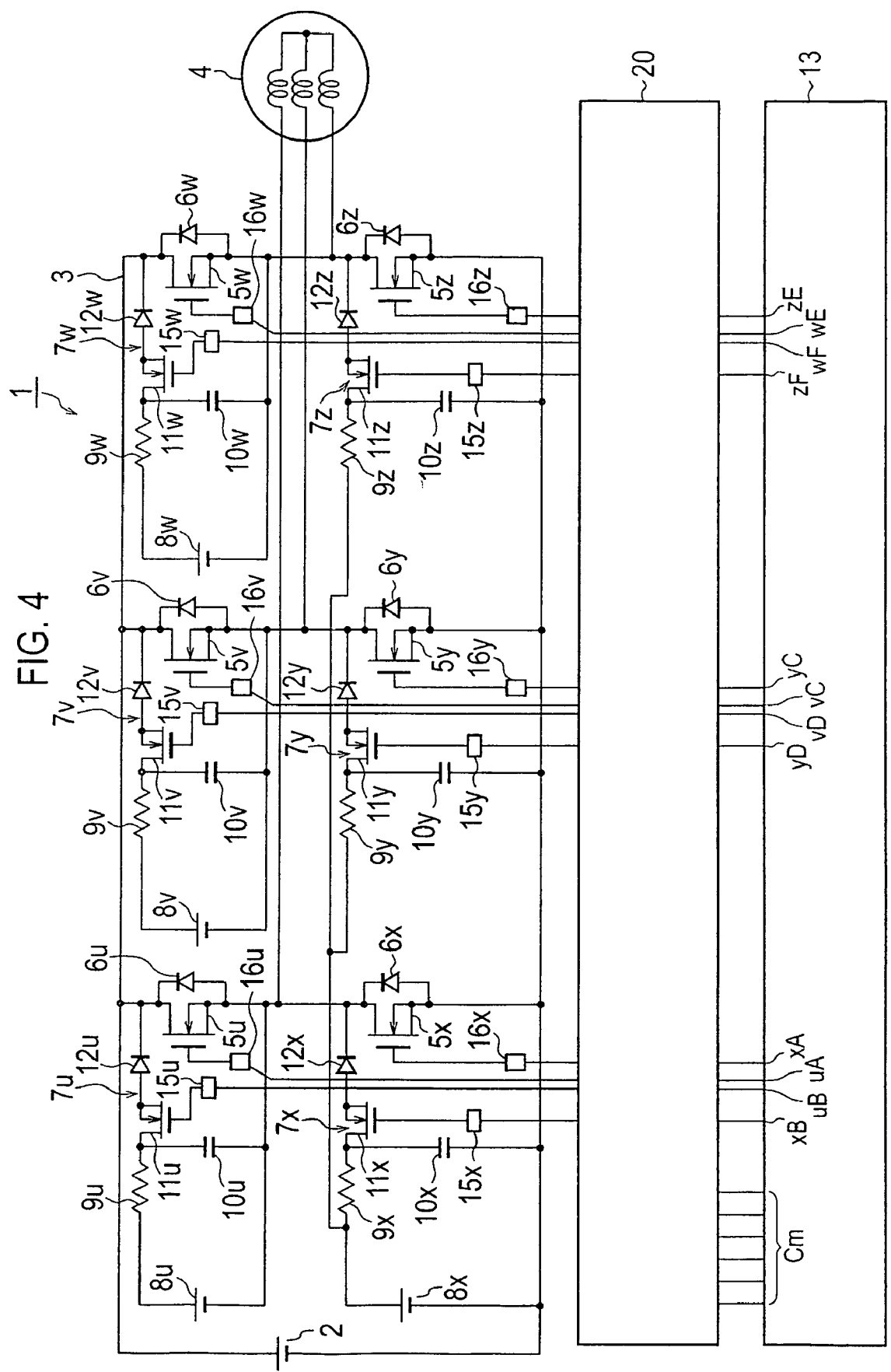
FIG. 4 is a whole configuration diagram showing a power converter in a second embodiment.

As shown in FIG. 4, in the power converter 1 concerning the second embodiment of the present invention, the reverse voltage application signal correction means 20 is connected between the inverter circuit 3 and the microcomputer 13.

Figure 5:
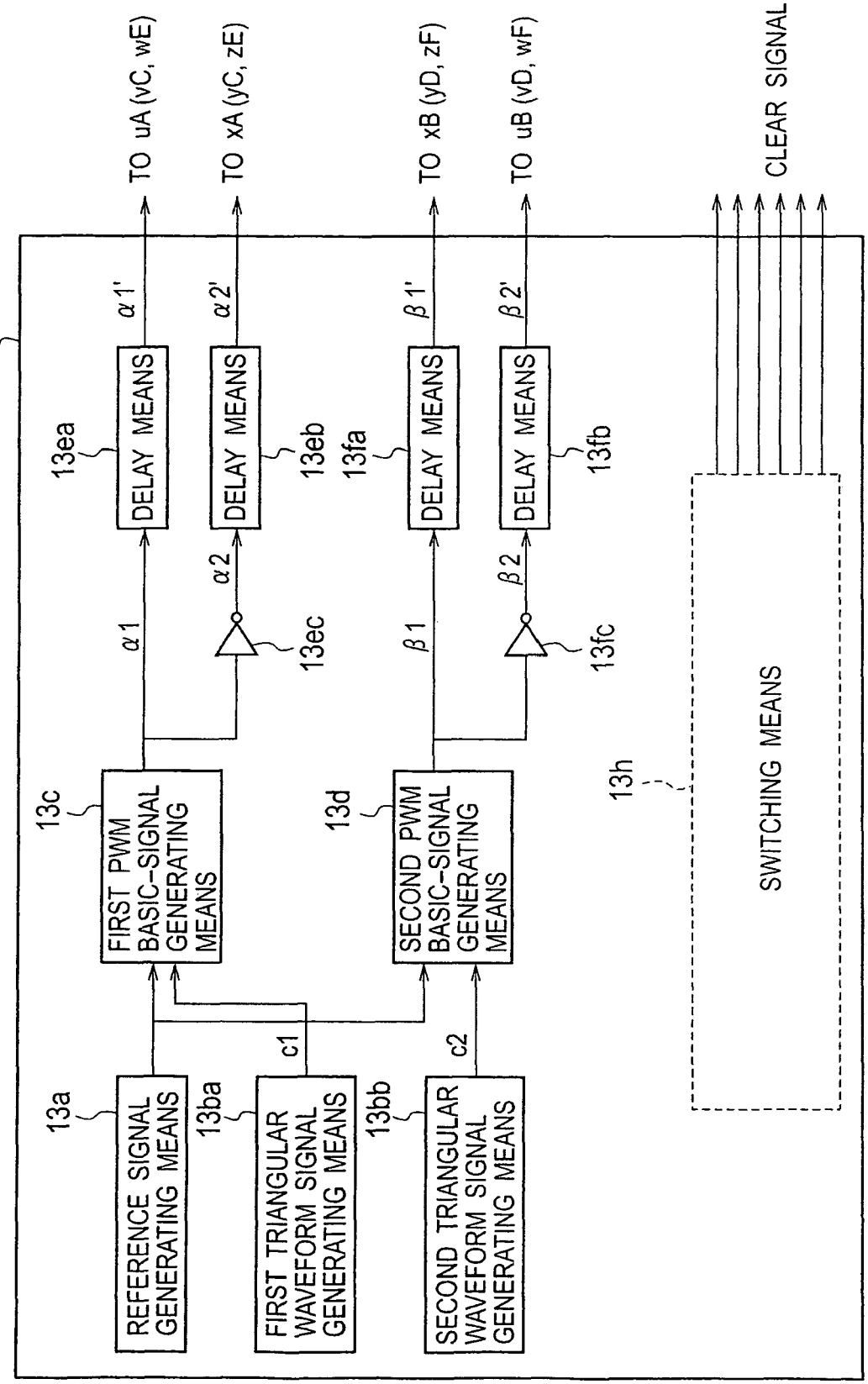
FIG. 5 is a block diagram showing the configuration of a microcomputer in the second embodiment.

As shown by the dashed line of FIG. 5, in the microcomputer 13, the switching means 13h that generates a clear signal Cm for stopping the generation of the reverse voltage application signal β" is provided. Namely, whether or not to output the reverse voltage application signal β" can be switched. Since the PWM basic-signal generating means in a microcomputer is typically formed by logic circuits provided therein, the PWM basic-signal generating means can turn on or off all the outputs of six phases, but it can neither cause a PWM basic signal corresponding to a specific main circuit switching element not to be outputted, nor cause only a specific reverse voltage application signal not to be operated. Then, in the second embodiment, the switching means 13h is provided inside the microcomputer 13 so as to allow the external output for switching the output/non-output of the individual reverse voltage application signal β" based on a control program in the microcomputer 13.

Figure 6:
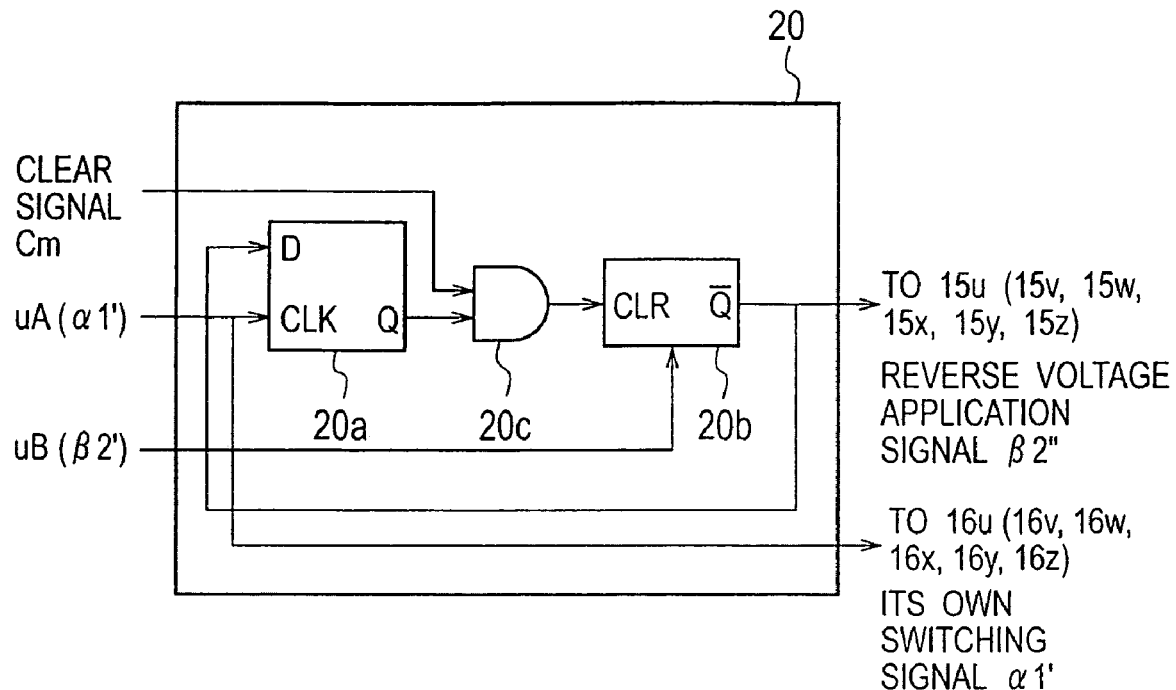
FIG. 6 is a block diagram showing the configuration of a reverse voltage application signal correction means in the second embodiment.

FIG. 6 shows the circuit configuration inside the reverse voltage application signal correction means 20. Note that, for simplicity of illustration, only parts related to one main circuit switching element 5U and the reverse voltage application circuit 7U corresponding to this switching element are extracted and illustrated in FIG. 6. Actually, this circuit is provided for each of the main circuit switching elements 5u to 5z, so a total of six circuits are required for the three phase inverter.

Inside the reverse voltage application signal correction means 20, there are provided a latch circuit 20a, a one-shot pulse generating means 20b, and an AND circuit 20c that receives the clear signal Cm from the switching means 13h and a signal from the latch circuit 20a, and supplies an AND output of the both signals to the one-shot pulse generating means 20b. Note that, also in this view, the circuits are basically configured as active low.

A switching signal (here, referred to as a "uA signal", for convenience' sake, and corresponding to α1' in FIG. 3 and FIG. 5) outputted via the output terminal uA to the U phase main circuit switching element 5u is inputted to the latch circuit 20a. This latch circuit 20a is a circuit so-called D latch circuit, wherein the uA signal is inputted to a CLK terminal, and the same value as the value of an input terminal D is provided to a Q terminal when the uA signal is "L" (ON). On the other hand, a reverse voltage application signal (here, referred to as a "uB signal" for convenience' sake) outputted via the output terminal uB from the microcomputer 13 is applied to the one-shot pulse generating means 20b serving as the one-shot pulse generating means. The one-shot pulse generating means 20b, if there is an "L" input of the reverse voltage application signal uB, will output, from this time point, an "L" signal from a Q bar output for a period determined by a CR time constant of a resistor and capacitor connected to a non-illustrated external terminal. This Q bar output serves as the reverse voltage application signal β2" for controlling the operation of the reverse voltage application switching element 11u. Moreover, the clear signal Cm and the Q output of the latch circuit 20a are inputted to a clear terminal (CLR) of the one-shot pulse generating means 20b via the AND circuit 20c. When "L" is being inputted to this clear terminal, the one-shot pulse generating means 20b becomes in a cleared state, i.e., the output becomes "H". Accordingly, if "L" is inputted to either of the inputs of the AND circuit 20c, then the reverse voltage application signal β2", which the Q bar terminal of the one-shot pulse generating means 20b outputs, becomes always "H", and thus the reverse voltage application operation will not be carried out.

Here, the clear signal Cm is usually set to an "H (permission)" output, and therefore while the one-shot pulse generating means 20b is performing the normal operation to output the reverse voltage application signal β2" of "L" from the Q bar for a predetermined period, if the switching signal uA for driving the own element 5u has changed to "ON" (from "H" to "L"), then the latch circuit 20a outputs from the Q terminal an "L" output of the reverse voltage application signal β2", which is outputted from the Q bar terminal of the one-shot pulse generating means 20b and inputted to the D terminal. Accordingly, in the AND circuit 20c, the output thereof changes from the previous "H" to "L", and the one-shot pulse generating means 20b is cleared, and then the reverse voltage application signal β2" of the Q bar terminal is set to "H", and thus the reverse voltage application operation is stopped. Then, since the output of the Q bar terminal is inputted to the D terminal of the latch circuit 20a, the Q terminal of the latch circuit 20a returns to "H" from "L", and the clear state of the one-shot pulse generating means 20b is canceled. However, the "H" output will be maintained until the reverse voltage application signal β2" becomes "L", again.

Accordingly, because the reverse voltage application signal correction means 20 is provided, it is possible not to cause the following state: a wasteful current keeps flowing when a timing at which the switching signal uA for driving the own element 5u becomes ON from OFF becomes earlier than a timing at which the reverse voltage application signal β2" corresponding to this element becomes OFF, namely when the ON period of a reverse voltage application signal set by the one-shot pulse generating means 20b is too long and thus the reverse voltage application operation will not be turned off even if the own element becomes ON.

Figure 7:
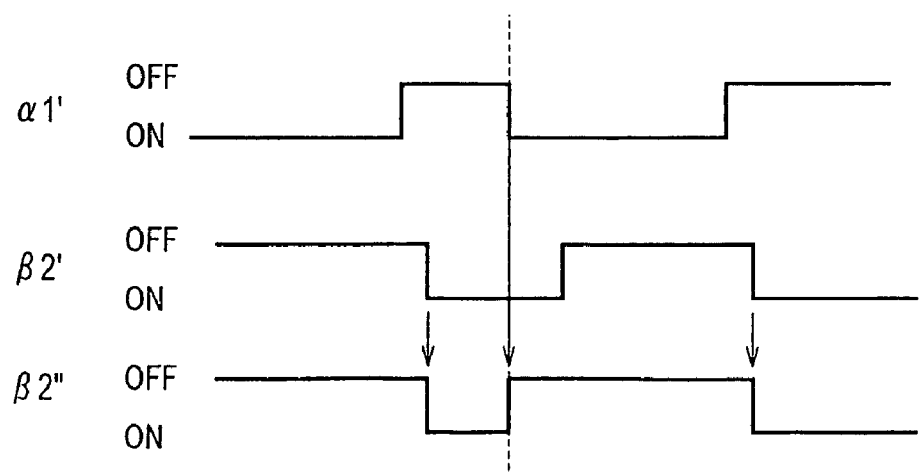
FIG. 7 is a time chart showing reverse voltage application signals before and after correction by the reverse voltage application signal correction means in the second embodiment.

A timing chart illustrated in FIG. 7 shows, from the top, the switching signal uA for driving the main circuit switching element 5u, the reverse voltage application signal β2' that has not been corrected by the reverse voltage application signal correction means 20, the reverse voltage application signal β2' being outputted from the microcomputer 13, and the reverse voltage application signal β2" that has been corrected by the reverse voltage application signal correction means 20, respectively. Note that this timing chart is also illustrated in the active-low condition.

In this way, a timing at which the signal for driving the main circuit switching element having a parasitic diode, to which a reverse voltage is applied, is turned on is used as a trigger to turn off the signal for applying a reverse voltage to the parasitic diode, the latter signal being generated by the reverse voltage application circuit. Thus, it is possible to prevent the reverse voltage application circuit from continuing to operate despite that the drive signal of the main circuit switching element is on, thereby preventing a wasteful current flow.

Note that, although in the second embodiment, on the basis of the ON signal of the switching signal of the own element, the operation of the reverse voltage application circuit 7 of this element is turned off, the same effect can be obtained even if the operation of the reverse voltage application circuit 7 of the own element is turned off at the OFF timing of the switching signal of the complementary element, the OFF timing occurring earlier by a delay time than the ON signal of the switching signal of the own element.

Moreover, when the reverse voltage application operation is set to the non-output (inhibit) operation by setting the clear signal Cm to "L", the output of the AND circuit 20c becomes always "L" regardless of the states of the switching signal uA and reverse voltage application signal uB (β2'). Accordingly, the Q bar terminal of the one-shot pulse generating means 20b becomes always "H", so that the operation of the reverse voltage application circuit 7 can be inhibited (stopped). Note that this inhibit operation can be set for each individual reverse voltage application circuit 7.

Third Embodiment

Next, a third embodiment in the present invention is described. In the description below, the same component as the component described in the first or second embodiment is given the same reference numeral, and the description of the same component is omitted.

Figure 8:
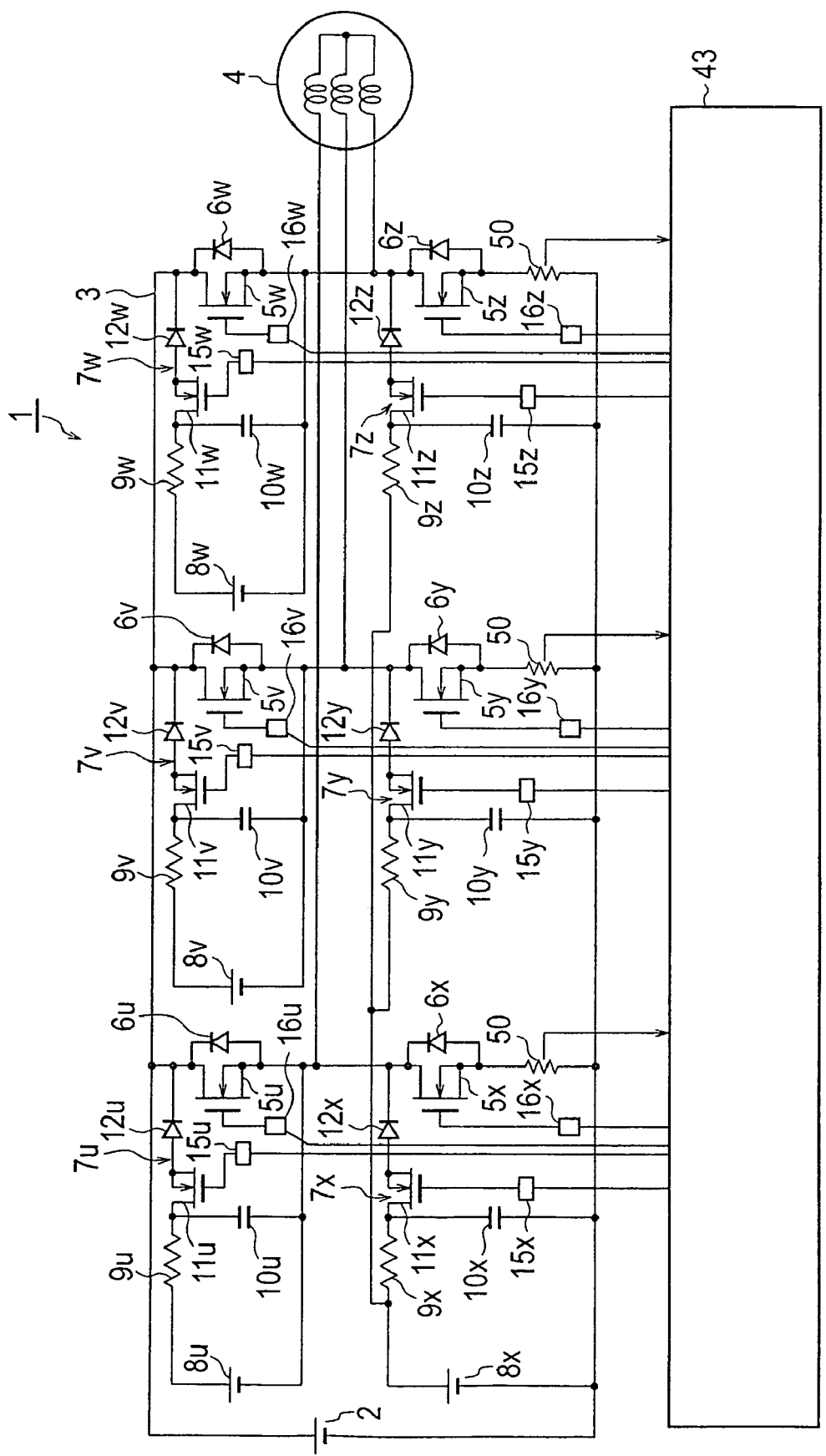
FIG. 8 is a whole configuration diagram showing a power converter in a third embodiment.

In the third embodiment, as shown in FIG. 8, the one-shot pulse generating means 14 provided on the inverter circuit side in the first embodiment is incorporated inside a microcomputer 43.

Figure 9:
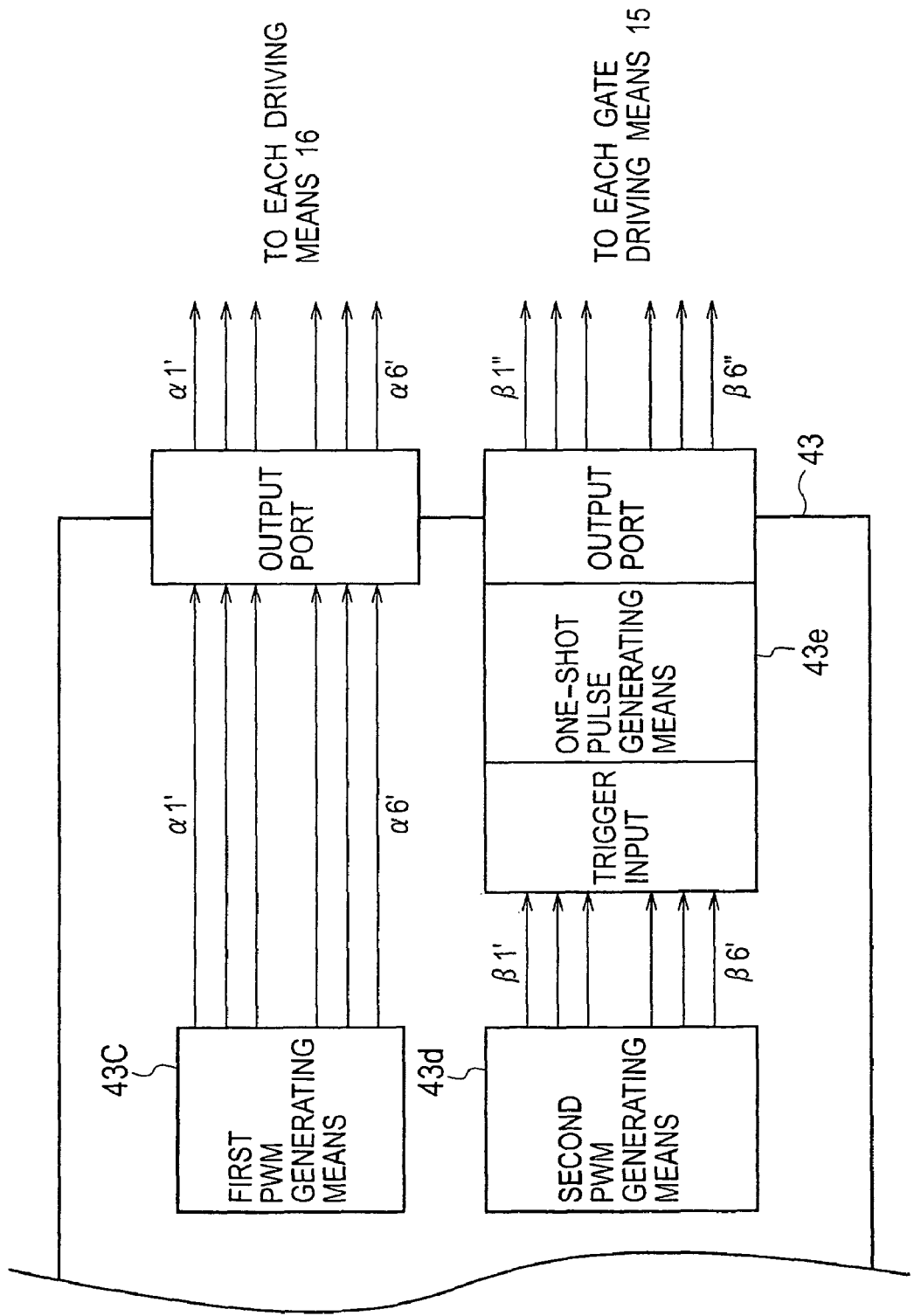
FIG. 9 is a block diagram showing the configuration of a part of a microcomputer in the third embodiment.
Figure 10:
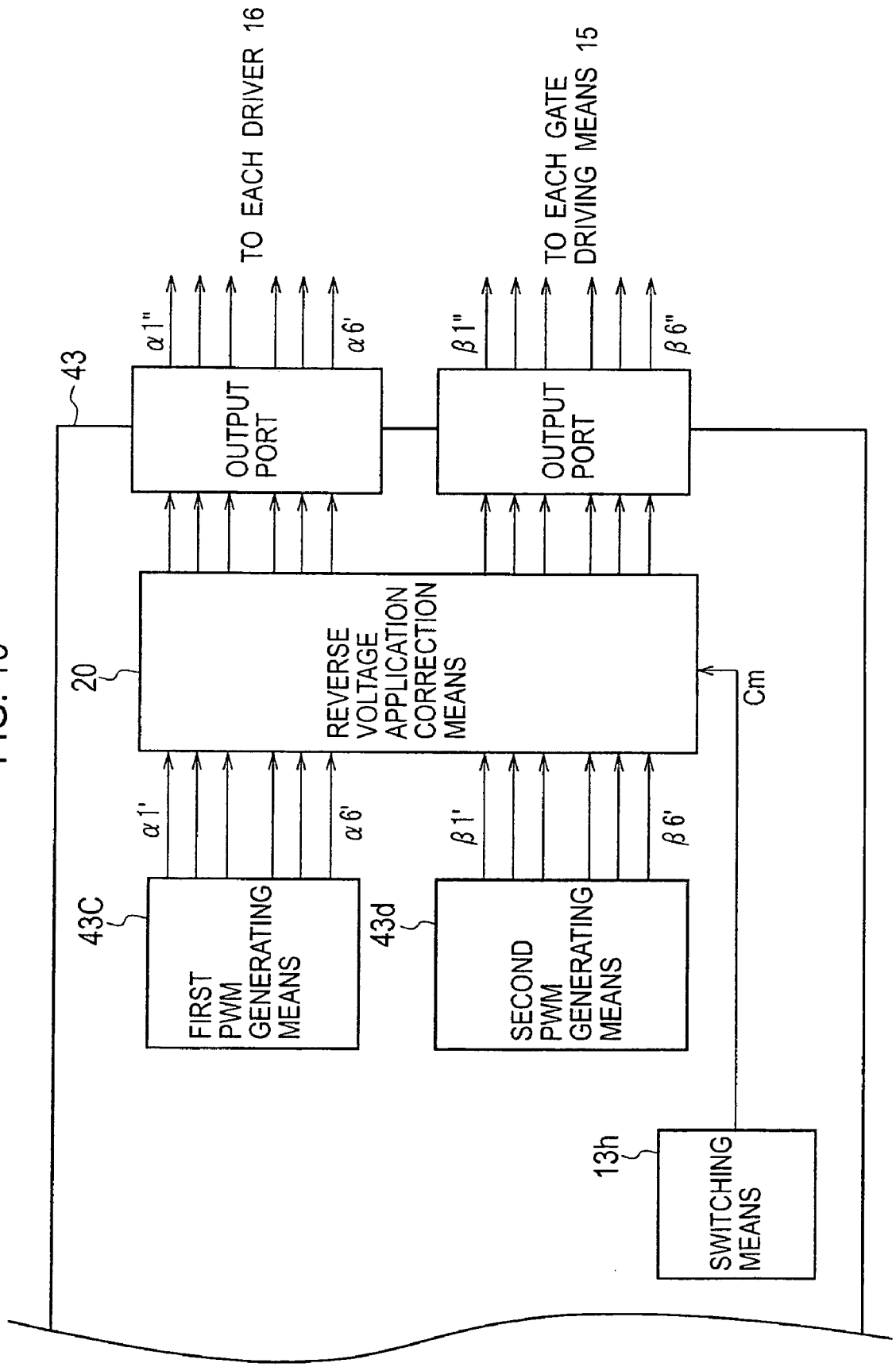
FIG. 10 is a block diagram showing the configuration of a part of a microcomputer in a fourth embodiment.
Figure 11:
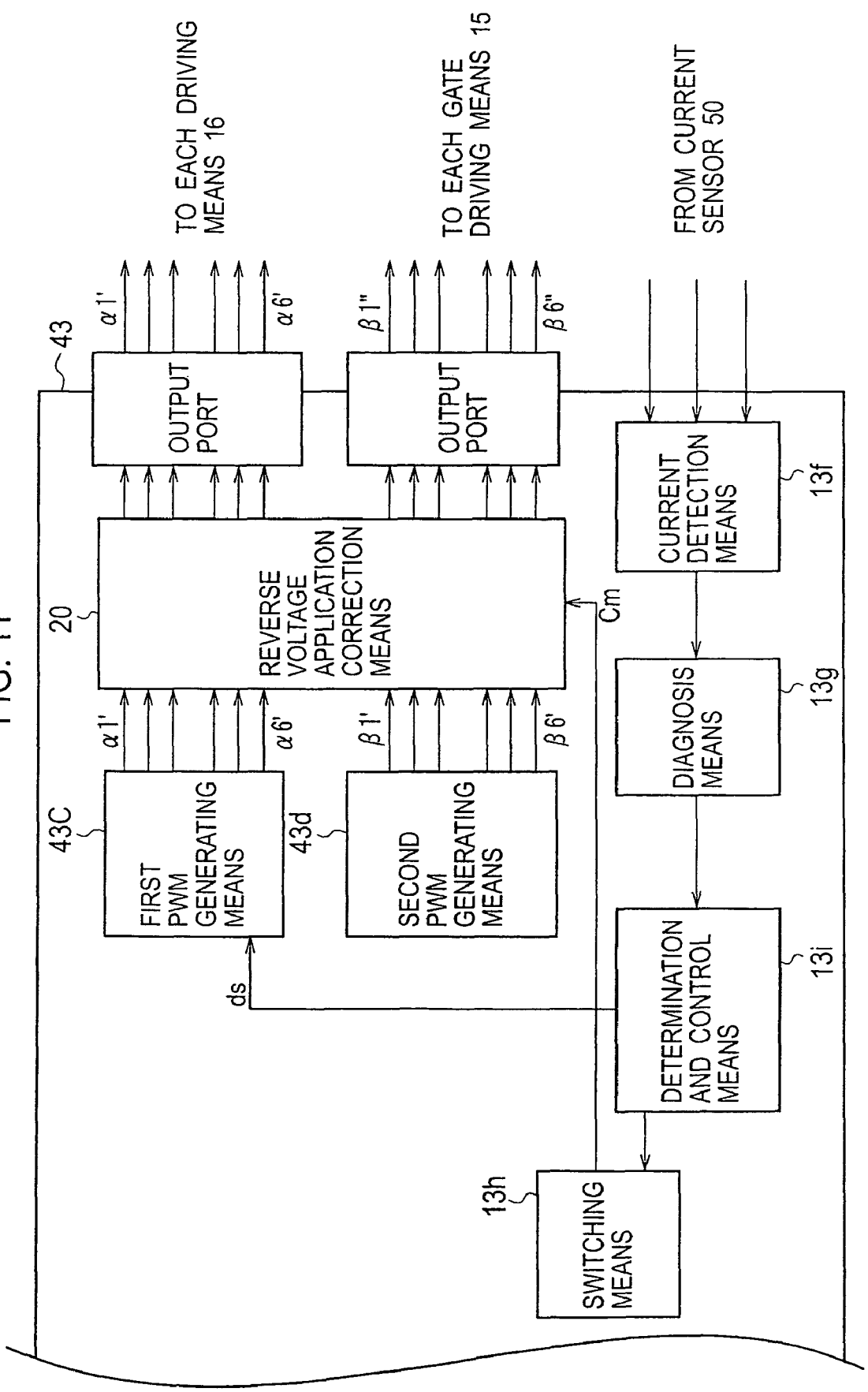
FIG. 11 is a block diagram showing the configuration of a part of a microcomputer in a fifth embodiment.

As shown in FIG. 9, the microcomputer 43 includes: a first PWM signal generating means 43c including the first PWM basic signal generating means and the delay means and inverting means connected thereafter in the first embodiment; a second PWM signal generating means 43d including the second PWM basic signal generating means and the delay means and inverting means connected thereafter in the first embodiment; and a one-shot pulse generating means for outputting reverse voltage application signals. Note that, in the block diagrams of FIG. 9 to FIG. 11 showing the microcomputer, the reference signal generating means 13a, the first triangular waveform signal generating means 13ba, and the second triangular waveform signal generating means 13bb are omitted.

In the first PWM signal generating means 43c, switching signals α1' to α6' of the respective main circuit switching elements of the U phase to Z phase are outputted from an output port provided for each phase of the U phase to Z phase of the microcomputer, respectively.

In the second PWM signal generating means 43d, generated second PWM signals β1' to β6' are inputted to a trigger input of the corresponding phase of the one-shot pulse generating means 43e, respectively.

The one-shot pulse generating means 43e is functionally the one made by arranging six one-shot pulse generating means 14 described in the first embodiment, and has six trigger inputs and outputs, respectively. The trigger input receives the second PWM signals β1' to β6' from the second PWM signal generating means 43d, and outputs reverse voltage application signals β1" to β6" having a pulse width of a predetermined time from the output port, with these second PWM signals as the trigger signals.

In this way, by providing the one-shot pulse generating means inside the microcomputer 43, it is possible to make the external circuit unnecessary and reduce the circuits provided on the inverter circuit 3 side, as shown in FIG. 8. Moreover, some of the commercially available microcomputers have an output terminal for a one-shot pulse, and in such microcomputers, in order to use an external trigger as the signal serving as the base for outputting a one-shot pulse, an input terminal for the external trigger is provided. According to the third embodiment, there is no need to provide such input terminal, and also external wirings can be omitted, and the microcomputer is made compact, and further circuits and the like added in the periphery of the microcomputer can be reduced.

Fourth Embodiment

Next, a fourth embodiment in the present invention is described. In this embodiment, the same component as the component described in the first to third embodiments is given the same reference numeral, and the description of the same component is omitted since it requires duplication.

In the fourth embodiment, as shown in FIG. 10, the reverse voltage application signal correction means 20 independently provided in the second embodiment is incorporated inside the microcomputer. Note that the hardware block configuration in this case is the same as that of FIG. 8 representing the third embodiment.

Fifth Embodiment

Next, a fifth embodiment in the present invention is described. Note that, in the fifth embodiment, the same component as the component described in the first to fourth embodiments is given the same reference numeral, and the description of the same component is omitted since it requires duplication.

In the fifth embodiment, as shown in FIG. 8, a current sensor 50, which detects a current flowing into a switching element by measuring a voltage between both ends of a resistor connected in series with the main circuit switching element of the inverter circuit 3, is provided to measure a current, thereby performing an abnormality diagnosis of the main circuit switching element and the reverse voltage application circuit.

As shown in FIG. 11, a current detecting means 13$f$, a diagnosis means 13$g$, and a determination and control means 13$i$ are newly provided inside the microcomputer 43. The current detecting means 13$f$ is connected to the current sensor 50, and the detection result of a current is sent to the diagnosis means 13$g$, where it is diagnosed whether the current detected by the current detecting means 13$f$ is an overcurrent. This diagnosis means 13$g$ is further connected to the determination and control means 13$i$, and transmits the diagnostic result thereto. The determination and control means 13$i$ proceeds with a diagnostic flow in order to further diagnose each part of the inverter circuit 3 based on the diagnostic result from the diagnosis means 13$g$. For this reason, in accordance with a diagnostic flow, the determination and control means 13$i$ performs a control to allow or not to allow the respective signal outputs to the first PWM generating means 43$c$ and switching means 13$h$. Note that, here, the first PWM generating means 43$c$ can output a PWM signal independently and freely for each element, the PWM signal being supplied to each main circuit switching element for the operation check of the inverter. Moreover, the second PWM signal generating means 43$d$ can output a reverse voltage application signal corresponding to the PWM signal, which the above-described first PWM generating means 43$c$ outputs. Furthermore, as described above, for the output of the reverse voltage application signal of the second PWM signal generating means 43$d$, the output/non-output can be switched by the output of a switching means 13$h$.

Figure 12A:
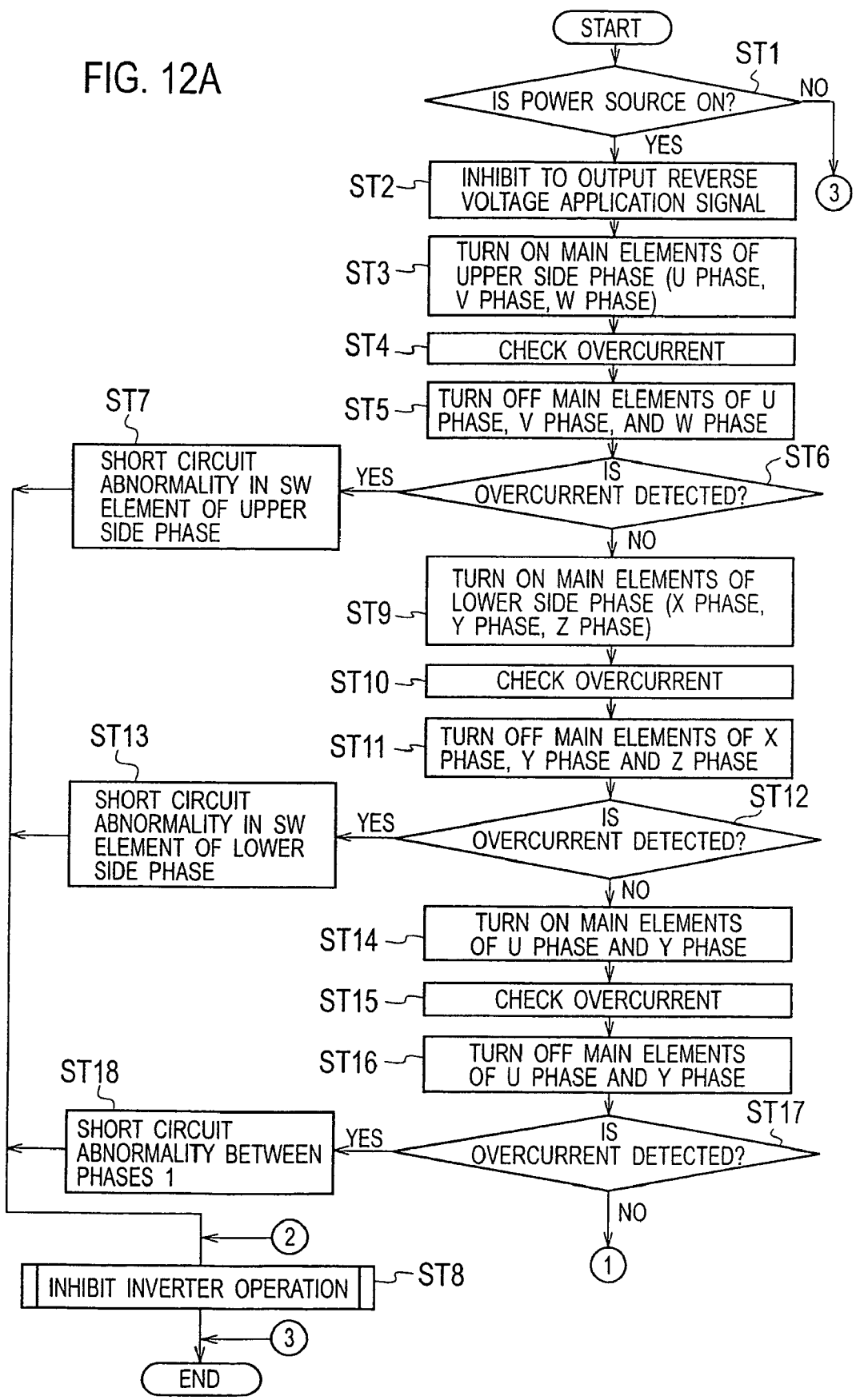
FIG. 12A is a flowchart showing a determination method in the fifth embodiment.

As shown in FIG. 12A, in the diagnostic flow, first, it is determined whether or not the power source of the inverter circuit 3 is ON (ST1). If the power source is not ON (N in ST1), the diagnosis will not be performed. This diagnostic flow is intended for the abnormality diagnosis of a main circuit switching element and a reverse voltage application circuit during startup of the inverter circuit 3.

If the power source is ON (Y in ST1), first, in the switching means 13$h$, the output of the reverse voltage application signal is inhibited (ST2). Note that, in the power converter wherein the switching of the output is performed outside the microcomputer, as shown in FIG. 4, the signal Cm for inhibiting the output of a reverse voltage application signal is transmitted from the microcomputer to the reverse voltage application signal correction means 20. By performing such control, the abnormality diagnosis of a main circuit switching element can be performed, first. Hereinafter, the steps through ST23 show the abnormality diagnosis flow of a main circuit switching element.

First, the abnormality diagnosis of the X phase, Y phase, and Z phase, which are the lower side phases, is performed. The determination and control means 13$i$ makes controls such that the first PWM generating means 43$c$ outputs a PWM signal for a short time period to the main circuit switching elements 5$u$, 5$v$, and 5$w$ of the U phase, V phases, and W phase, thereby turning on the main circuit switching elements 5$u$, 5$v$, and 5$w$ (ST3). Then, currents having flown into these elements are detected with the current detecting means 13$f$ via the current sensor 50, and then whether or not this is an overcurrent is diagnosed (checked) in the diagnosis means 13$g$ (ST4). Upon receipt of this diagnostic result, the determination and control means 13$i$ makes controls such that the first PWM generating means 43$c$ turns off the output of the PWM signal to the main circuit switching elements 5$u$, 5$v$, and 5$w$ (ST5). During this period, the switching elements 5$x$, 5$y$, and 5$z$ of the lower side phase remain OFF under control. Accordingly, if an overcurrent is detected in the diagnosis means 13$g$, either of the switching element 5$x$, 5$y$, or 5$z$ of the lower side phase may be spontaneously turned on or may be in a short-circuit failure.

The determination and control means 13$i$ determines whether or not the diagnostic result from the diagnosis means 13$g$ is an overcurrent (ST6), and if an overcurrent is detected (Y in ST6), it is determined that the main circuit switching element 5$x$, 5$y$, or 5$z$ of the lower side phase is most likely to be short-circuited (destroyed) (ST7), and the operation of the inverter circuit 3 is inhibited hereafter (ST8).

If the main circuit switching element 5$x$, 5$y$, or 5$z$ of the lower side phase is not short-circuited (N in ST6), then an abnormality diagnosis of the U phase, V phase, and W phase, which are the upper side phases, is performed in a similar manner. That is, with the main circuit switching elements 5$u$, 5$v$, and 5$w$ being turned off, the main circuit switching elements 5$x$, 5$y$, and 5$z$ are kept ON for a short time period (ST9), and it is diagnosed (checked) whether or not a current that has flow at this time is an overcurrent (ST10). Then, the first PWM generating means 43$c$ is controlled so as to turn off the main circuit switching elements 5$x$, 5$y$, and 5$z$ (ST11), and then it is determined whether or not the diagnostic result from the diagnosis means 13$g$ is an overcurrent (ST12). If an overcurrent is detected (Y in ST12), it is determined that the main circuit switching element 5$u$, 5$v$, or 5$w$ of the upper side phase is most likely to be short-circuited (destroyed) (ST13), and thus the operation of the inverter circuit 3 is inhibited also in this case (ST8).

Then, it is diagnosed whether or not there is a short circuit abnormality between the respective phases of the U phase to W phase and X phase to Z phase. First, a short circuit abnormality between the U phase and Y phase is diagnosed. The determination and control means 13$i$ makes controls such that the first PWM generating means 43$c$ outputs a predetermined PWM signal to the main circuit switching elements 5$u$ and 5$y$ of the U phase and Y phase for a short time period, thereby setting the main circuit switching elements 5u and 5y to the ON state (ST14). Then, the determination and control means 13i diagnoses (checks) currents having flown into these elements, via the current sensor 50 (ST15), and receives this diagnostic result. Upon receipt of this diagnostic result, the determination and control means 13i makes controls such that the first PWM generating means 43c turns off the output of the PWM signal to the main circuit switching elements 5u and 5y of the U phase and Y phase (ST16).

The determination and control means 13i determines whether or not the diagnostic result from the diagnosis means 13g indicates an overcurrent (ST17), and if an overcurrent is detected (Y in ST17), then it is determined that the main circuit switching element 5u and 5y are most likely to be short-circuited because a current that should naturally flow through a motor winding has flown without going through the motor winding (ST18), and the operation of the inverter circuit 3 is inhibited also in this case (ST8).

Figure 12B:
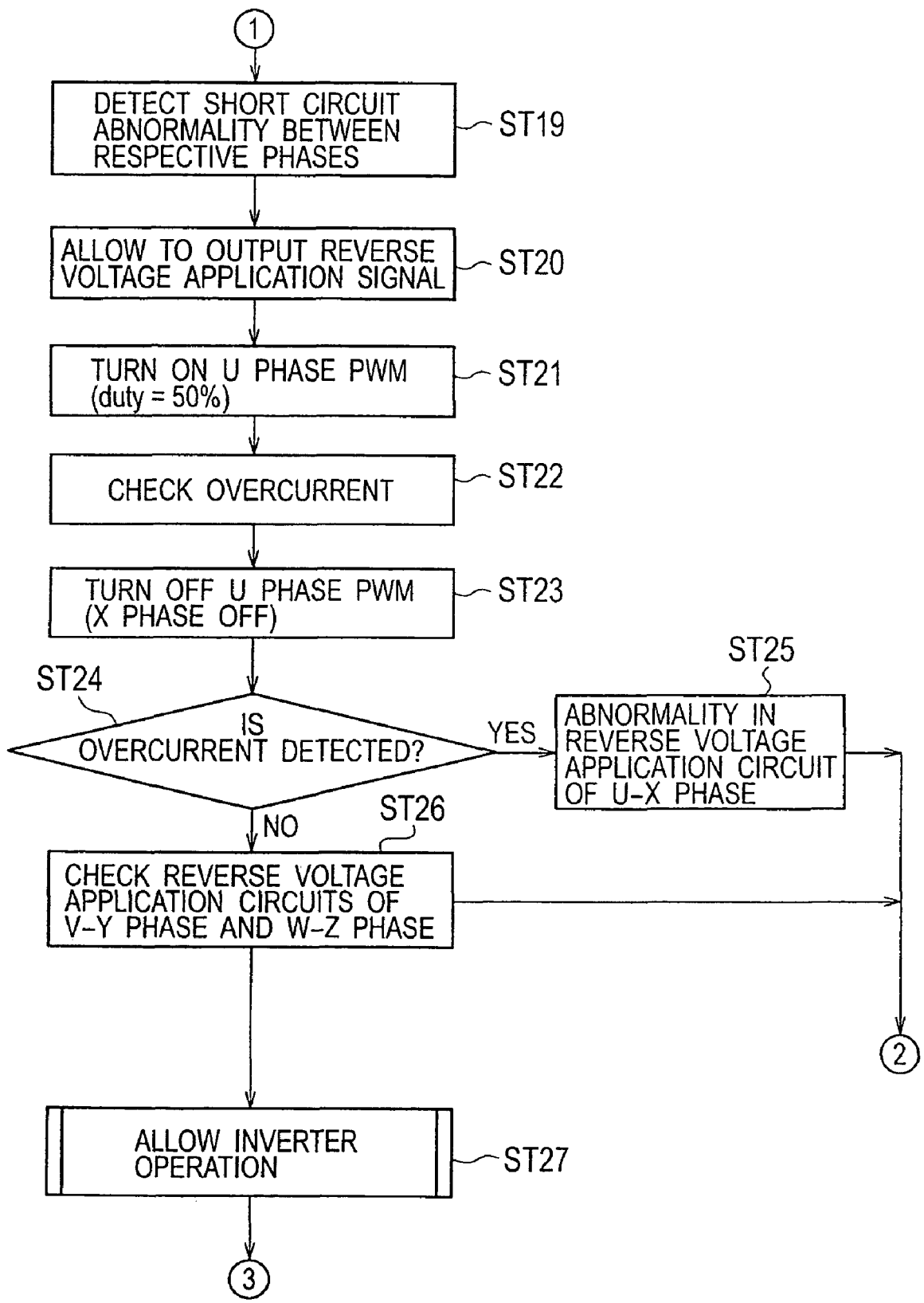
FIG. 12B is a flowchart showing the determination method in the fifth embodiment.

As shown in FIG. 12B, if it is diagnosed in the diagnosis means 13g that the detection current in the current detecting means 13f is not an overcurrent (not short-circuited between the main circuit switching elements 5u and 5y) because only a predetermined low level current through the motor winding flows (N in ST17), then a short circuit abnormality between the respective phases of the U phase to W phase and X phase to Z phase will be diagnosed in a similar manner (ST19) although the detailed steps are omitted from the flowchart.

If an abnormality has not been found in the above processes, then an abnormality diagnosis of a reverse voltage application circuit is performed.

First, a signal to allow the output of a reverse voltage application signal is transmitted to the switching means 13h (ST20), causing the first PWM generating means 43c to output the first PWM signal with the duty cycle of 50% to the U phase for a short time period (ST21). In this case, to the X phase, a signal obtained by inverting the output to the U phase is supplied. Along with the drive of the main circuit switching elements of these U phase and X phase, each reverse voltage application signal is also being outputted. Then, currents when these elements are operating are detected with the current detecting means 13f via the current sensor 50, and then whether or not these currents are overcurrents is diagnosed (checked) in the diagnosis means 13g (ST22). That is, if the reverse voltage application means 7 of each element operates normally, a large reverse current will not flow into the anti-parallelly connected diode 6, and therefore an overcurrent will not be detected in the current detecting means 13f. On the other hand, if the reverse voltage application means 7 is defective, a large reverse current flows into the anti-parallelly connected diode 6 at the ON timing of the complementary element, which will then be detected in the current detecting means 13f. Upon completion of the overcurrent check, the determination and control means 13i will control the first PWM generating means 43c so as to turn off the output of the first PWM signal to the U phase and X phase, once (ST23).

The determination and control means 13i determines whether or not the diagnostic result from the diagnosis means 13g is an overcurrent (ST24), and if an overcurrent has been detected (Y in ST24), then it is determined that there is most likely an abnormality in the reverse voltage application circuits of the U phase and X phase (ST25). Accordingly, in this case, as shown in FIG. 12A, the operation of the inverter circuit 3 is inhibited (ST8).

If it is determined that there is no abnormality in the reverse voltage application circuits of the U phase and X phase (N in ST24), then an abnormality diagnosis of the reverse voltage application circuits of the V phase and Y phase, and W phase and Z phase is performed through the same steps as in the abnormality diagnosis of the reverse voltage application circuit of the U phase and X phase (ST26, the detailed steps are omitted).

If an overcurrent has not been detected in all the above operations, it is determined that there is no abnormality in all the circuits, so the start operation of the inverter circuit 3 is allowed (ST27). Now, the abnormality diagnosis of the main circuit switching elements and the reverse voltage application circuits during the startup of the inverter circuit 3 is completed.

In this way, an abnormality diagnosis is performed by exploiting easy control of permission or non-permission of the reverse voltage application signal output. Accordingly, it is possible to separately diagnose the main circuit switching element and the reverse voltage application circuit to see which of them has an abnormality.

Note that, in each embodiment of the present invention, a three phase inverter for driving a motor is taken as an example, but the present invention can be implemented to not only a motor but also to any inductive load. Moreover, the present invention can be implemented also to a single phase inverter.

Moreover, the present invention is not limited to the above-described embodiments themselves, but in its implementation stage the above-described embodiments may be realized by modifying the components without departing from the scope of the present invention. Moreover, various kinds of inventions can be made by suitably combining a plurality of components disclosed in the above-described embodiments. For example, several components may be eliminated from all the components shown in the embodiments. Furthermore, the components pertaining to the different embodiments may be suitably combined.

INDUSTRIAL APPLICABILITY

The present invention can be used in various power converters, such as an inverter apparatus and a converter apparatus, for example.

The invention claimed is:
1. A power converter comprising:
   a pair of main circuit switching elements connected to a direct-current voltage source and supplying power to an inductive load by ON/OFF drive, at least one main circuit switching element of the pair being configured of an FET;
   a diode connected in antiparallel with each of the pair of main circuit switching elements;
   a reverse voltage application means that applies a reverse voltage lower than a voltage of the direct-current power source to the diode connected in antiparallel with the FET;
   a first PWM basic-signal generating means that generates a first PWM basic signal for ON/OFF-driving the pair of main circuit switching elements;
   a second PWM basic-signal generating means that generates a second PWM basic signal having a phase lead with respect to the first PWM basic signal; and
   a one-shot pulse generating means that generates a reverse voltage application signal based on the second PWM basic signal, the reverse voltage application signal being for driving the reverse voltage application means for a predetermined period.

2. A power converter comprising:
a pair of main circuit switching elements connected to a direct-current voltage source and supplying power to an inductive load by ON/OFF drive, at least one main circuit switching element of the pair being configured of an FET;
a diode connected in antiparallel with each of the pair of main circuit switching elements;
a reverse voltage application means that applies a reverse voltage lower than a voltage of the direct-current power source to the diode connected in antiparallel with the FET;
a switching signal generating means that generates switching signals of the pair of main circuit switching elements based on a PWM basic signal in order to ON/OFF drive the pair of main circuit switching elements;
a one-shot pulse generating means that generates a reverse voltage application signal for operating the reverse voltage application means at a predetermined timing; and
a signal correction means that receives a reverse voltage application signal, and a switching signal concerning the FET, to which a reverse voltage is applied based on the reverse voltage application signal, and that outputs the inputted reverse voltage application signal as it is when the switching signal is OFF, and turns off the inputted reverse voltage application signal when the switching signal is ON.

3. The power converter according to claim 1, characterized in that wherein a plurality of the PWM basic-signal generating means and the one-shot pulse generating means are provided inside a microcomputer.

4. The power converter according to claim 1, comprising:
a current detector that detects a current flowing into the inductive load;
a diagnosis means that diagnoses whether or not a current detected by the current detector is an overcurrent; and
a determination and control means that determines, based on a result diagnosed by the diagnosis means, whether or not there is an abnormality in the pair of main circuit switching elements and in the reverse voltage application means, while controlling whether or not to allow the output of ON/OFF switching signals of the pair of switching elements and the reverse voltage application signal.

5. The power converter according to claim 2, comprising:
a current detector that detects a current flowing into the inductive load;
a diagnosis means that diagnoses whether or not a current detected by the current detector is an overcurrent; and
a determination and control means that determines, based on a result diagnosed by the diagnosis means, whether or not there is an abnormality in the pair of main circuit switching elements and in the reverse voltage application means, while controlling whether or not to allow the output of ON/OFF switching signals of the pair of switching elements and the reverse voltage application signal.

6. The power converter according to claim 3, comprising:
a current detector that detects a current flowing into the inductive load;
a diagnosis means that diagnoses whether or not a current detected by the current detector is an overcurrent; and
a determination and control means that determines, based on a result diagnosed by the diagnosis means, whether or not there is an abnormality in the pair of main circuit switching elements and in the reverse voltage application means, while controlling whether or not to allow the output of ON/OFF switching signals of the pair of switching elements and the reverse voltage application signal.

* * * * *